United States Patent [19]

Calhoun

[11] Patent Number: 4,964,945
[45] Date of Patent: Oct. 23, 1990

[54] LIFT OFF PATTERNING PROCESS ON A FLEXIBLE SUBSTRATE

[75] Inventor: Clyde D. Calhoun, St. Paul, Minn.

[73] Assignee: Minnesota Mining and Manufacturing Company, St. Paul, Minn.

[21] Appl. No.: 281,655

[22] Filed: Dec. 9, 1988

[51] Int. Cl.$^5$ .......................... B44C 1/22; C25F 3/02; H05K 3/06
[52] U.S. Cl. .................... 156/632; 156/633; 156/634; 156/664; 156/666; 156/668; 156/902; 427/96; 427/282
[58] Field of Search ............... 156/632, 633, 634, 660, 156/666, 668, 664, 901, 902; 427/96, 282

[56] References Cited

U.S. PATENT DOCUMENTS

| | | | |
|---|---|---|---|
| 3,192,136 | 6/1965 | Reid | 156/644 |
| 3,526,573 | 9/1970 | Kepple | 156/630 |
| 3,540,047 | 11/1970 | Walser et al. | 343/18 |
| 3,728,177 | 4/1973 | Caule | 156/630 |
| 4,447,292 | 5/1984 | Schuster-Woldon | 156/644 |
| 4,474,845 | 10/1984 | Hagerman | 156/62.4 |
| 4,710,263 | 12/1987 | Kato | 156/630 |

FOREIGN PATENT DOCUMENTS

| | | | |
|---|---|---|---|
| 2029413 | 10/1970 | France | 156/657 |
| 59-229727 | 12/1984 | Japan | 427/282 |

OTHER PUBLICATIONS

Official Gazette, Oct. 20, 1987, p. 1578, Publication regarding U.S. Ser. No. 739,548 (U.S. Pat. No. 4,701,761 not issued).

Primary Examiner—David L. Lacey
Assistant Examiner—Todd J. Burns
Attorney, Agent, or Firm—Donald M. Sell; Walter N. Kirn; Warren R. Bovee

[57] ABSTRACT

A method of providing patterned, thin-film materials on flexible substrates by depositing a first, etchable, integral mask onto a substrate, depositing a second pattern material over the mask region and then removing the mask, such as by etching. Patterned films useful as printed circuits and the like can be prepared by this method. In an alternate embodiment, patterned particles can be prepared for dispersion in a vehicle or matrix using the described process.

19 Claims, 4 Drawing Sheets

LIFT OFF PATTERNING PROCESS ON A FLEXIBLE SUBSTRATE

TECHNICAL FIELD

The present invention relates to a method for providing patterns of etch-resistant material on substrates using an integral mask and a mask-specific removal agent.

BACKGROUND OF THE INVENTION

There are many uses for thin films carried on rigid or flexible substrates. Printed circuits are exemplary of such utility and are widely used. Other characteristics can be built into thin films by depositing them in certain patterns.

Typically, patterned thin films have been prepared by depositing the film on a substrate using a deposition mask or by etching unpatterned thin films using conventional photoresist and etching. These techniques have a variety of disadvantages. Deposition masks must be precisely positioned and held in place where low/critical tolerances are involved. It is difficult to avoid relative movement between the mask and the deposition substrate. This is particularly true where the substrate is flexible.

Etching techniques also have disadvantages. Use of this technique involves depositing relatively large areas of an unpatterned thin film and etching it to the desired pattern. The deposition of larger areas of a continuous film produces stress within the film and promotes cracking and spalling. Stress problems are accentuated where multiple layers of distinct materials having different thermal and/or chemical properties are involved. Moreover, etching is not as precisely controllable a process as may be necessary for small-dimension, tight tolerance patterns. Further, many materials are difficult to etch by ordinary chemical techniques. That is, their etch rate is impractically slow with common etchants or such severe etch conditions are required that surrounding materials are undesirably affected.

As discussed above, the generation of patterns in inorganic films is known and has found wide spread use in the printed circuit industry. The process that is widely used is photolithography. A variation on the conventional photolithography process is to use a negative relief mask. Negative relief masks are also used in electroforming and in additive photolithography, but in these instances the top of the mask is not coated. The use of a negative relief mask in vacuum metallization processes results in the top of the mask being coated. Solvents attack the relief mask either through pin holes in the film or through discontinuities in the film along the edges of the mask or by cutting both the mask and the film so as to provide direct access of the solvent to the mask. In some limited instances, inorganic negative relief masks have been used to take advantage of the higher temperature capabilities and lower vapor pressure in vacuum metallization chambers. When using inorganic negative deposition masks, the masks are normally removed by selective etching with an acid To date, processing has been limited to small rigid substrates and only single film thicknesses about 0.1 μm thick have been imaged.

BRIEF DESCRIPTION OF THE INVENTION

It has now been discovered that the "throwing" power of certain deposition processes can be used to advantage to overcome the deficiencies in prior art processes. More specifically, it has been found that certain deposition processes will deposit material substantially in a line-of-sight so that when used in combination with certain etchable mask materials, integral, etchable masks can be formed on, and removed from, flexible substrates. It has also been discovered that certain etchable materials can be built up to useful masking dimensions for use with difficult-to-etch thin film pattern materials. Both substractive and additive photolithographic techniques can be used to form the mask.

The present invention overcomes the deficiencies in the prior art by providing a unique method by which patterns in inorganic films can be formed where: (1) The substrate employed is flexible and is continuously transported past one or more deposition stations so that large quantities of material can be made inexpensively, (2) the inorganic films employed are difficult to etch, (3) the inorganic films can be relatively thick, e.g., greater than 0.1 μm, and (4) The inorganic films can be patterned with excellent resolution.

More particularly, the present invention relates to a method of providing a pattern of difficult-to-etch materials on flexible substrates comprising the steps of:

(a) providing a mask of a first, etchable material comprising integral physical protrusions on a first surface of a carrier or substrate. The protrusions are generally normal to the surface to provide a raised negative pattern on the substrate;

(b) depositing through the mask region a layer of a second, difficult-to-etch, pattern material, different from the first material In one embodiment, the deposition is accomplished by continuously moving a substrate past a deposition station. By using a deposition technique having poor throwing power, such as electron beam evaporation, the second material can be deposited primarily on surfaces parallel to the plane of the substrate surface and does not completely cover or seal the vertical walls of the protruding mask material. This vertical separation or exposure allows the further step of:

(c) selectively etching the mask material to remove it and to leave a positive pattern of the second material deposited on the substrate.

In a preferred embodiment, the second pattern material is deposited in the form of one or more layers of the same or different materials all of which are different from the mask material.

As used in this application, "difficult to etch" or "unetchable" materials are materials which have a relatively slow etch rate with a given etchant relative to the mask material which is used such that the mask can be successfully removed without adversely affecting the pattern material.

The method of the present invention is useful for providing patterns of a variety of materials on rigid or flexible substrates. The present method is advantageous because precisely controlled patterns can be deposited within very tight tolerances. In addition, because the pattern material is deposited as a relatively small portion of material, the stresses can be more easily dissipated compared to a larger deposit which is subsequently patterned. This reduces the cracking and spalling problems associated with the deposition of larger portions of material. Yet another advantage is that the flexible substrate is provided with additional stiffness and rigidity due to the presence of the integral mask.

This aids in the handling of the substrate and reduces the possibility of delamination of the pattern material after completion of the patterning process.

DETAILED DESCRIPTION OF THE INVENTION

Figure 1:
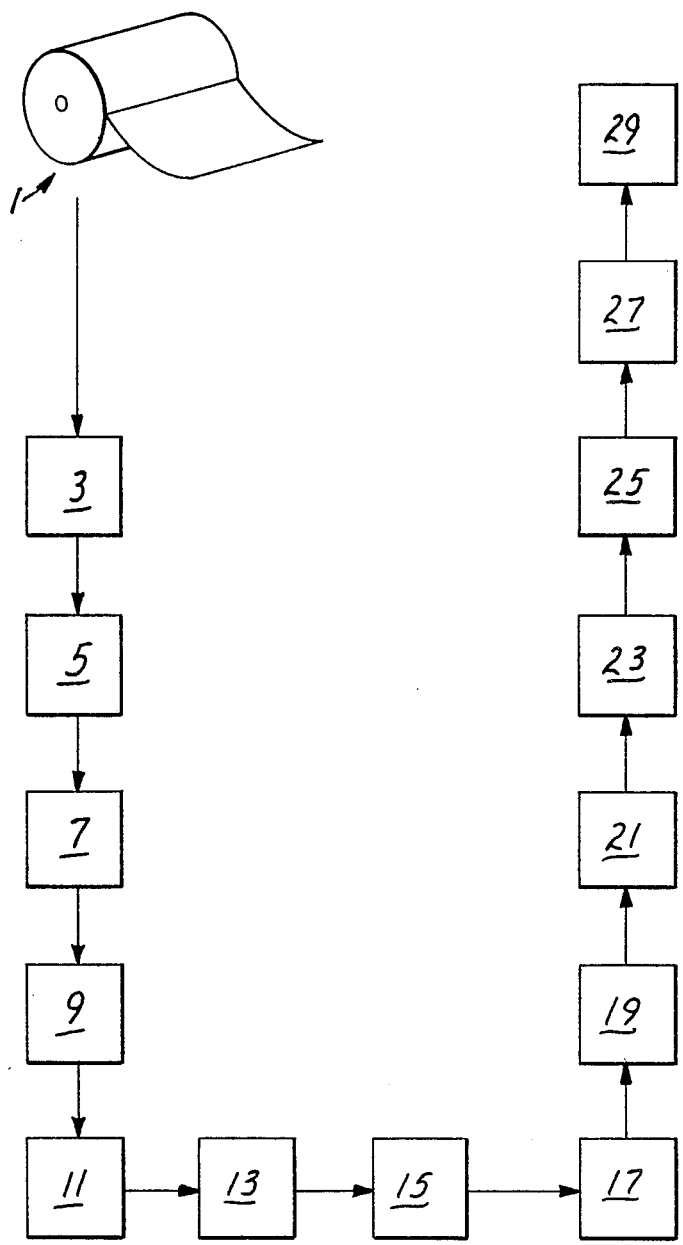
FIG. 1 is a flow diagram of the patterning process described in the present application.

The method of the present invention can be more clearly explained by reference to the drawings. FIG. 1 shows a flow chart of the various steps of a preferred process according to the present invention. FIGS. 2-8 are views of a portion of the patterned material as it may exist in the various stages of the process.

A substrate 52, such as a flexible film shown at step 1 of FIG. 1, is selected for the process. The substrate should have sufficient dimensional stability, and retain such properties under the environmental conditions it will experience in processing and use, so that the difference between thermal expansion coefficients will be minimized and the materials it carries and supports will not be inclined to separate from the substrate. Steel, ceramics, such as glass, and thick sheets of polymer are commonly used as rigid substrates. Stainless steel or polymeric films are commonly used as flexible substrates. Polyimide films such as those which are commercially available under the trade name "Kapton" (DuPont) are particularly preferred because of their ability to retain integrity and dimensional stability at relatively high temperatures, e.g., 200°-300° C.

As shown in FIGS. 1 and 2-5, a priming layer 54 may be deposited on the film at step 3. This layer is intended to improve adhesion of subsequently-applied metallic layers as is well known in the art. For example, various organic resins and metal oxides can be used if desired to improve the adhesion of copper to polyimide. Where the primer layer is not needed, it can be omitted. For simplicity and clarity, the primer layer 54 is not shown in the remaining figures. The next step is to deposit a sublayer of the etchable mask material, such as copper, on the substrate. In one method, a thin sublayer 56 of the mask material is sputtered or otherwise deposited onto the substrate, or on the primer layer 54, if present, typically to a thickness of about 1000-1500 Å as shown at step 5. The sublayer 56 may be further thickened by electroplating, as at location 7, if deemed desirable for further processing.

Figure 2:
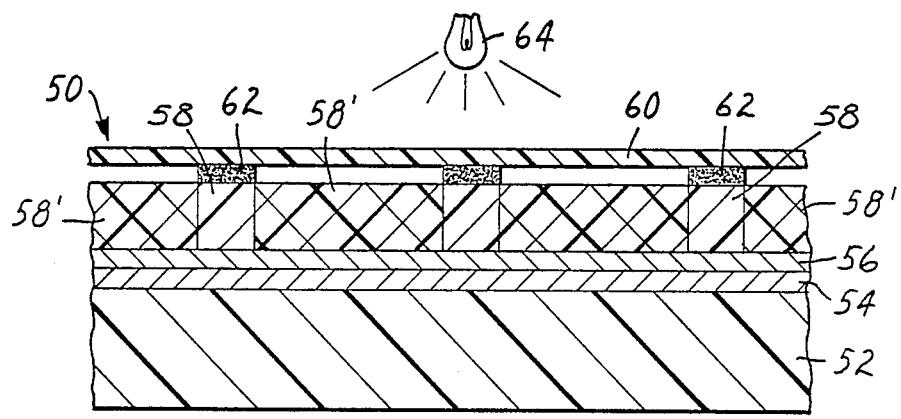
FIGS. 2-8 are plan views and cross sections of a sheet material at various stages in the patterning process.
Figure 4:
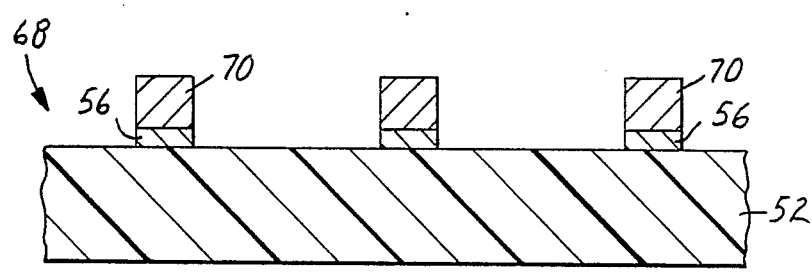
Figure 5:
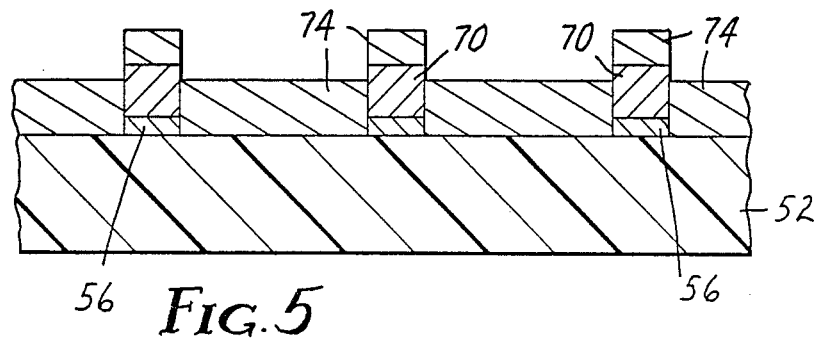

One method of forming an integral mask 70 as shown in FIGS. 4 and 5 which will have the desired pattern is by the use of an "additive" process which will now be described. Photoresist material 58 is laminated to or coated on the copper surface, at step 9, and the photoresist exposed to light 64 through a stencil 60 (as at step 11). The stencil 60 can be made by conventional photographic or other well-known techniques which can be readily selected depending on the dimension and precision required for the pattern. It can be a positive or a negative of the desired mask depending on whether positive or negative photoresist is used. In the present description, the stencil will be a positive of the mask. Thus, where the stencil is a screen pattern, the pattern lines 62 will be opaque, preventing the passage of light. The photoresist 58 will remain uncured in the areas where no light strikes layer 58 as shown in FIG. 2 of the drawing and be cross-linked in the remaining areas 58' under the transparent portion of the stencil. A cross-section of the article 50 existing at this stage of the process is shown in FIG. 2.

Figure 3:
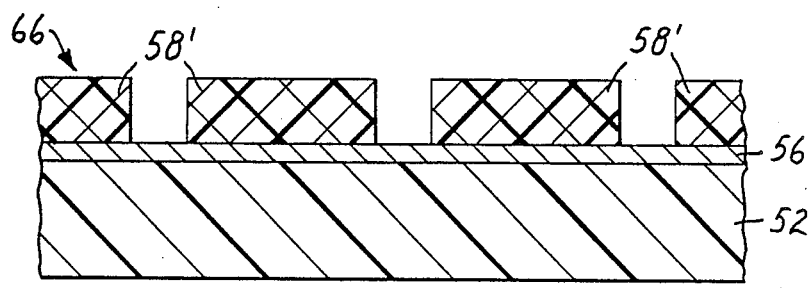

After the photoresist 58 has been exposed to light and cured in certain areas 58, it is washed with developer at step 13 to remove the unreacted portions corresponding to the opaque lines 62 of the stencil 60. The resulting cross-section of article 66 is shown in FIG. 3.

The exposed copper is then cleaned or etched by conventional techniques, e.g., a dilute (5%) solution of sulfuric acid, to prepare the surface for further electroplating at step 15 and then it is subjected to a copper electroplating process, at step 17, to deposit additional copper in the exposed areas to form the integral mask 70 as shown in article 68 in FIG. 4. The copper mask 70 is built up to a height which will equal or exceed the expected height of the pattern material to be subsequently applied. The height should be sufficient to allow the mask 70 to provide boundaries for the pattern material 74 to be subsequently applied, and still allow exposure of the copper mask to subsequent etching as will be explained in connection with FIG. 5. Typically, a height of up to 2 mils is sufficient for masking thin film materials. However, the upper limit is based solely on practical considerations such as the integrity of the mask material 70 being deposited, the nature of the pattern material to be deposited, the degree of interference by the mask 70 with the subsequent deposition of the pattern material 74, etc.

The pattern material would generally range in thickness greater than 0.1 $\mu$m and up. For some applications, relatively thick films of 0.5 $\mu$m and up are useful and may range up to 1 or 2 $\mu$m or more in thickness As noted, thicker films can be made if desired, limited only by the height of the mask which can be 2 mils (50 $\mu$m) or more thick.

While the process has been described herein with respect to the use of copper as the mask material 70, other commonly used, etchable metals could be employed as could organic materials that can be selectively removed without adversely affecting the pattern material 74 which is applied. Thus, various soluble or strippable polymers could be used as mask material 70 so long as they have sufficient integrity and stability to form a useful mask, are not adversely affected by the deposition process or the pattern material 74, and can be selectively removed. Examples of potential mask materials are organic photoresists and the like which can withstand the temperatures of the deposition process without melting, decomposing, or outgassing to a degree that the pattern material will be adversely affected.

When deposition of the integral mask 70 has been completed, the remaining cross-linked photoresist 58' is stripped away by conventional techniques at step 19 and the exposed copper sublayer 56, formerly protected by the photoresist 58', is removed, such as by flash etching at location 21. While some minor portion of the mask material 70 may also be removed, the amount is generally insufficient to substantially affect the mask. In any event, the height of the deposited mask 70 should be selected with the flash etch step in mind if that technique is to be used so that the amount remaining after the flash etch will provide a suitable mask.

In another embodiment of the invention, the mask is prepared by a subtractive, rather than an additive, process. That is, rather than building up the copper screen as described in connection with FIGS. 1–4 of the drawings, a thick copper foil is laminated to a substrate, such as a polyimide sheet and, with the use of photoresist techniques as previously described, the unwanted portions of the copper are etched away leaving a copper screen or mask as shown in FIG. 4.

In the practice of this process, it may be preferable to begin with a commercially available polyimide/copper laminated composite, eliminating the electroplating of additional copper to form the integral mask at steps 15 and 17. Rather, the photoresist is laminated to the copper foil and light-exposed through a stencil in association with steps 9 through 13. In the case of the subtractive technique, the photoresist is stripped away/-developed where it is desired to deposit the pattern material and the copper is then etched away in those areas to provide an integral mask 70, on a substrate 52 as shown in FIG. 4 (less sublayer 56). After stripping the remaining photoresist, the material is then processed the same as if an additive technique were used for forming the mask.

An integral, precisely located mask 70 has now been formed on the flexible substrate 52 as shown in FIG. 4 and the pattern material 74 can now be deposited onto the substrate 52 bearing the integral mask 70. The pattern material can be any of a number of difficult-to-etch materials which will provide the desired decorative or utilitarian function such as metals, alloys, ceramics, and organic polymeric materials.

Conductive metals such as silver, tungsten, or carbon may be useful. Certain ceramic, magnetic, dielectric and also certain purely decorative materials may also be used with advantage for a number of end uses.

A number of conventional deposition techniques can be used for the step occurring at location 23. However, it is desirable that a technique having limited throwing power be used so that some portion of the vertical surfaces of the mask 70 are uncovered or unsealed so the mask 70 is accessible to the mask-specific removal agent, such as a copper etch which does not adversely affect the pattern material, to allow subsequent removal of the mask 70. The deposition process also has to be operative at temperatures which will not adversely affect the mask material.

In practice, it has been found useful to employ any of a variety of vapor deposition processes to deposit the patterning material. As examples, electron beam evaporation can be used for metal alloy deposition and induction evaporation can be used for non-conductive materials. These processes exhibit poor throwing power. That is, they tend to deposit very little material on surfaces normal to the substrate surface because the streams of material being deposited are essentially line-of-sight straight and parallel without substantial turbulence. Stated another way, poor throwing power means the surfaces parallel to the emission streams of material are not substantially coated or sealed. Thus, the vertical surfaces of the mask will not be covered or sealed by the pattern material.

The pattern material 74 can be deposited as thickly as desired so long as the height of the mask 70 is not exceeded. If the mask 70 were completely covered, there would be no access point for subsequent removal, as by etching. A single layer or multiple layers of pattern material 74 can be deposited. The layers of pattern material 74 can be the same or different so long as they are sufficiently compatible to perform the desired end use, e.g., they adhere to one another and are not undesirably chemically reactive.

Figure 9:
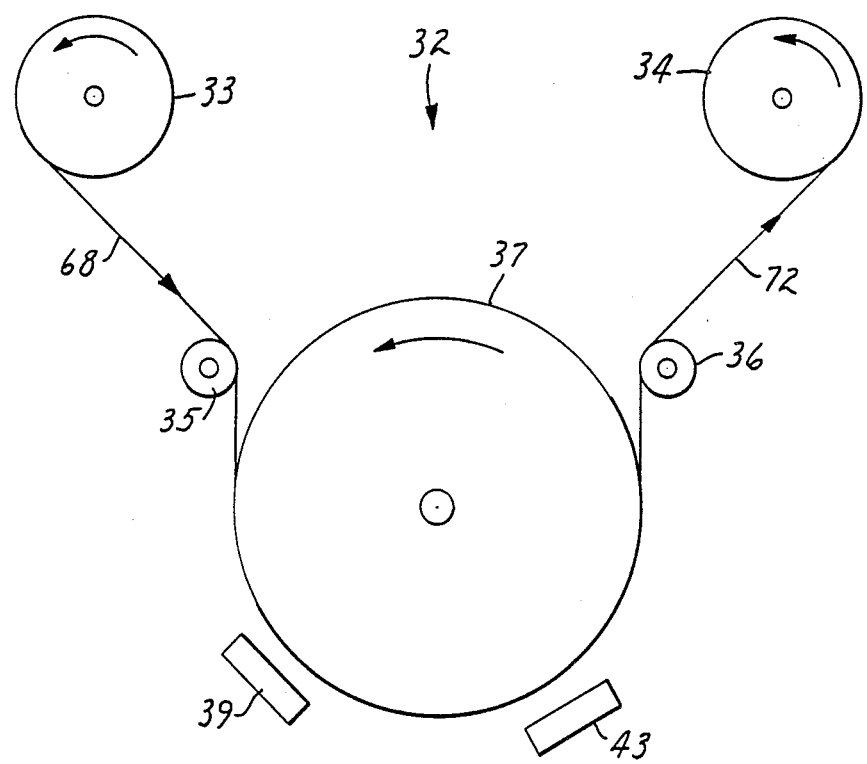
FIG. 9 is a schematic view of a pattern deposition apparatus useful in the present invention.

In FIG. 9, a schematic diagram of a pattern apparatus 32 for continuously depositing pattern material is shown. The apparatus 32 comprises reversible takeup and supply reels 33, 34 on which the masked substrate 68 is wound. The substrate 68 passes over tension rollers 35,36 and a reversible coating roll 37 which can be heated or cooled, if necessary. Two separate deposition stations 39 and 43 are shown. They may be the same or different. Although two are shown, the process may be used with only a single station and more than two stations could be useful for some applications.

In operation, the substrate 68 is first fed from supply reel 33, around roll 37, and taken up on roll 34 after coating by one or both of stations 39 and 43. The speed of the substrate 68 is chosen to allow the desired amount of pattern material to be deposited on the substrate 68. Alternating layers of different materials can be deposited by reversing rolls 33 and 34, using station 39 to coat in one direction and 43 to coat in the other. Alternatively, both coating stations can be operated simultaneously when operated in either direction to provide various layering effects.

The deposition stations represented at 39 and 43 can be any of a variety of known deposition systems which have limited throwing power with the pattern material to be deposited. Solid metals may be deposited by evaporation techniques such as electron beam evaporation. Non-metallic solid materials can be deposited by conventional techniques such as inductive or resistive evaporation and the like.

When the pattern material deposition has been completed, the article 72 will have a cross-section similar to that shown in FIG. 5 wherein the pattern material 74 has been deposited on the surfaces of the copper mask 70 which are normal to the deposition streams. Although a significant portion of the vertical walls of the mask 70 have been obstructed by the build-up of the pattern material 74, a portion of the copper mask 70 near the top of the mask remains unobstructed and exposed to permit subsequent attack by a mask-specific removal agent.

After pattern deposition, the mask material 70, 56 can be removed as shown at step 25. Typically, the mask material 70, 56 is an etchable metal and can be removed by a chemical etch, such as sulfuric acid for copper, that is specific for the mask material 70 leaving the pattern material 74 in place.

Figure 6:
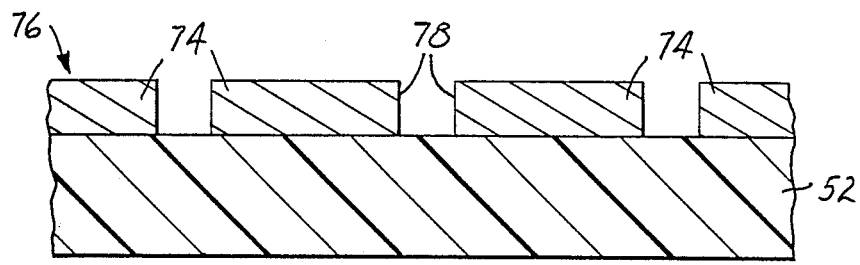

Removal of the substrate primer 54, if used (see FIG. 2), occurs at step 27. Chemicals used to remove the primer layer should not attack the pattern material. A cross-section of patterned product 76 is shown in FIG. 6 where the vertical edges 78 of the pattern material 74 as separated by the void left by removal of the mask material 70.

Figure 8:
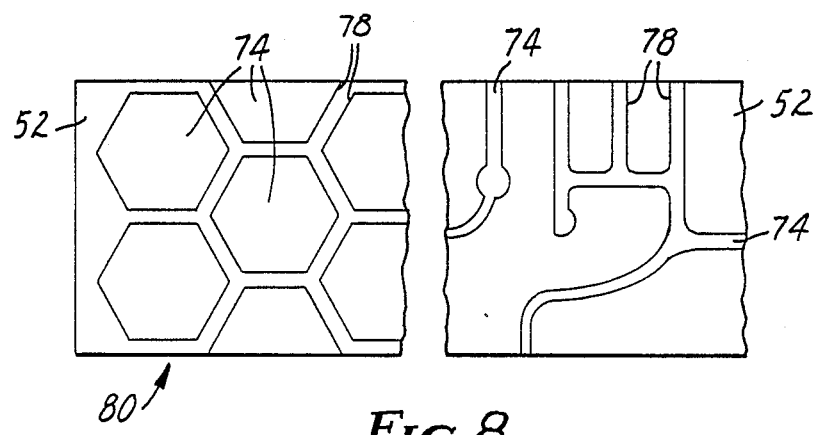

A top view of a patterned article 80 is shown in FIG. 8 where the pattern material 74 is shown in various patterns separated by precisely controlled spaces formed by the edges 78 of the pattern material 74. The width and precision of these spaces is dictated by the technology available to prepare the stencil 60, control of the shadowing effects caused by excessive mask height, proper choice of etching materials, etching conditions and the like.

Figure 7:
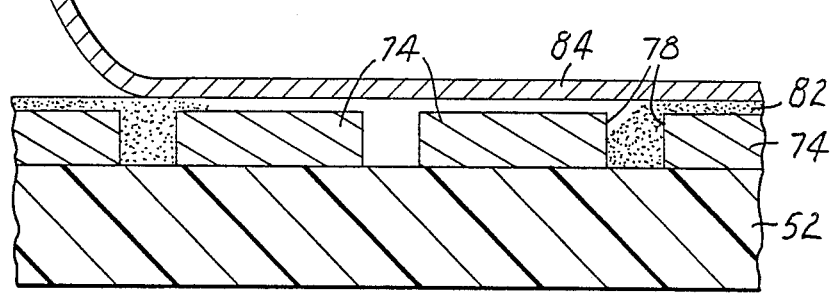

At location 29 of the process shown in FIG. 1, a number of converting operations may be performed on the patterned article. For example, the article may be cut, slit, or punched into various shapes. A layer 82 of protective or adhesive material may be added to prevent contamination or allow bonding of additional materials thereto. The flexible patterned articles may be rolled, stacked, laminated, or the like depending on the ultimate intended application. The adhesive layer may have a release liner 84 as shown in FIG. 7.

The patterned articles of the present invention may find utility for various decorative or electrical applications, such as printed circuit boards and the like, wherein the patterns comprise conductive patterns of carbon, difficult-to-etch superconducting materials and the like.

In an alternate embodiment of the invention, the process shown in FIG. 1 can be modified to provide precisely shaped pieces of particles of pattern material. More particularly, the patterning process is practiced, as in FIG. 1, except that the flash etch step normally performed at step 21 to remove a portion of the mask material 56 (see FIGS. 2–5) which is not directly under the protruding mask features 70 is eliminated.

As a result of eliminating this step, the pattern material 74 is deposited on top of the mask sublayer 56. Consequently, when the subsequent etching of the mask material 70 occurs, as indicated at location 25 in FIG. 1, the copper sublayer 56 under the pattern material 74 is also attached and pattern material 74 is released from the sublayer 52. Where the pattern material 74 is in the shape of discrete islands, small pieces or particles of the pattern material are obtained These may be in the form of long threads, rectangles, circles or other desirable geometric shapes, and may comprise one or more layers of materials just as in the previously-described process. The size distribution of particles can be controlled by the pattern employed. The mixture of particles may have a distribution of particle sizes from very narrow and essentially homogeneous to a very wide size distribution. The thickness of the multiple layers within particles, where employed, may also be controlled.

The pieces or particles so obtained may be separated from the etching material, such as by filtration, electric or magnetic separation, agglomeration, or the like, and collected together and may be useful alone or in a mixture with other materials. For example, they may be incorporated in various liquid vehicles or matrices such as a polymeric resin to provide reinforced composition plastics, coatings, paints, and the like. Alternatively, they may be useful as abrasive or optically functional materials depending on their composition.

The process has been described above with reference to rather specific materials. However, alternatives will be readily apparent to those skilled in the arts to which the invention pertains when made aware of this disclosure.

EXAMPLE

In order to demonstrate the practice of the present invention, a printed circuit device is made. To make the device, one surface of a flexible polyimide film (Kapton, DuPont) was coated with copper by sputter deposition. A layer of positive acting photoresist 0.5 mil (13 $\mu$m) thick was laminated to the copper coating. The photoresist was exposed and developed using a printed circuit negative as the stencil.

In the areas where the photoresist material was removed by developing, the copper was electroplated to provide a mask having a height of less than about 0.5 mil (13 $\mu$m). The remaining photoresist was then removed and the sample flash-etched using acid/potassium dichromate etch to remove the copper film in the non-mask areas.

The masked sheet was then put into a vacuum chamber and coated with several hundred angstroms of carbon. The copper mask material was then etched away using a sulfuric acid/potassium dichromate etch to leave a printed circuit pattern of carbon on the polyimide substrate.

I claim:

1. A method of making a patterned deposit on a flexible substrate comprising the steps of:
   providing a flexible, sheet-like substrate and integral with at least a portion of one major surface of said sheet a first, etchable masking material which stiffens the flexible substrate and defines physical protrusions generally normal to said surface of said substrate; and
   depositing over at least a portion of the masked region a second, pattern material chemically different from said first material, said second, pattern material being deposited primarily on said exposed substrate and mask surfaces which are parallel to the plane of said major surface of said substrate,;
   controlling said deposition so that said mask material is not completely covered or sealed; and
   applying a chemical agent to selectively etch away said first masking material whereby a pattern of said second material remains on said substrate.

2. A method according to claim 1 wherein said deposition is continuous and is accomplished by continuously moving said substrate past a deposition station.

3. A method according to claim 1 wherein the substrate is a polymeric film.

4. A method according to claim 3 wherein said polymeric film is selected from the group consisting of polyimide and polyester polymers.

5. A method according to claim 1 wherein said mask material is selected to provide rigidity and stability to the substrate during patterning.

6. A method according to claim 5 wherein the mask material is a conductive metal.

7. A method according to claim 5 wherein the masking material is deposited on the substrate by electroplating.

8. A method according to claim 5 wherein the masking material is selected from the group consisting of copper and etchable organic materials.

9. A method according to claim 1 wherein said second material is selected from the group consisting of metals, ceramics, and polymers.

10. A method according to claim 1 wherein said second material is a material selected from the group consisting of electrically conductive, magnetic, and dielectric materials.

11. A method according to claim 1 wherein said second pattern material comprises multiple layers wherein at least one layer is chemically different from at least one other layer.

12. A method according to claim 1 wherein the second material is deposited by a process selected from the group consisting of evaporation and sputtering.

13. A method according to claim 1 wherein said chemical agent for removing the masking material is an acid.

14. A method according to claim 13 wherein said mask is copper and said acid is chromic acid.

15. A method of making articles having a shape corresponding to a pre-selected pattern comprising the steps of:

provinding a substrate and covering at least a portion of said substrate with a first, etchable masking material integral with said substrate, and which includes physical protrusions normal to said surface of said substrate, depositing on at least a portion of the masked region a second, pattern material chemically different from said first masking material, said second pattern material being deposited primarily on said first masking material which is parallel to the surfaces of said substrate; and discontinuing said deposition before all of said masking material is completely covered; and applying a chemical agent to selectively etch away said first masking material underneath said pattern material whereby said pieces of said pattern material are released from said substrate.

16. A method according to claim 15 wherein said masking material protrusions define boundaries for said pattern material to be deposited as discrete islands of material.

17. A method according to claim 15 wherein said pattern pieces are separated from said etching material and said substrate and collected together.

18. A method according to claim 17 wherein said collected pieces are dispersed in a liquid vehicle.

19. A method according to claim 17 wherein said collected pieces are dispersed in a polymeric resin.

* * * * *